United States Patent [19]

Piepers

[11] Patent Number: 4,514,700
[45] Date of Patent: Apr. 30, 1985

[54] OUTPUT AMPLIFIER FOR A TRANSMITTING TUBE

[75] Inventor: Harry Piepers, Eindhoven, Netherlands

[73] Assignee: U.S. Philips Corporation, New York, N.Y.

[21] Appl. No.: 459,857

[22] Filed: Jan. 21, 1983

[30] Foreign Application Priority Data

Feb. 18, 1982 [NL] Netherlands .......................... 8200633

[51] Int. Cl.$^3$ .............................................. H03F 3/60
[52] U.S. Cl. .................................................... 330/56
[58] Field of Search ........................... 330/53, 56, 286; 333/35, 222

[56] References Cited

U.S. PATENT DOCUMENTS 4,070,627  1/1978  Jasinski et al. .................... 330/56 X Primary Examiner—James B. Mullins
Attorney, Agent, or Firm—Robert J. Kraus

[57] ABSTRACT

The invention relates to an output amplifier for a transmitting tube, having an operating frequency located in the FM- and the VHF- frequency bands. In order to match the output impedance of the preamplifier to the input impedance of the output amplifier the output amplifier includes a broad-band impedance transformer. Mechanical and electrical flexibility is obtained by using an impedance transformer formed from series/parallel arrangements of coaxial cables. The impedance transformer needs little room and nevertheless provides a broadband impedance match.

5 Claims, 3 Drawing Figures

OUTPUT AMPLIFIER FOR A TRANSMITTING TUBE

BACKGROUND OF THE INVENTION

The invention relates to an output amplifier for a transmitting tube, more specifically for a transmitting tetrode having an operating frequency located in the frequency band from 40–400 MHz. The output amplifier includes a first cylindrical conductor provided at one end with contacts to which the electrodes of the transmitting tube can be connected and a second cylindrical conductor which is arranged coaxially relative to the first cylindrical conductor. The two conductors form part of a first impedance transformer for transforming the input impedance of the transmitting tube to a first input impedance at the other end of the coaxial conductors.

Output amplifiers of this type are generally known and are used in, for example, FM radio and television transmitters. The output amplifier is provided to amplify the applied input signal which has been preamplified to for example, some hundreds of Watts, to the ultimate transmitting power of, for example, 30 kW. In order to match the output impedance of the preamplifier (for example 50 Ohms) to the input impedance of the active portion of the transmitting tube (for example 12 Ohms in parallel with 62 pF) the prior art output amplifiers utilize impedance transformers in the form of quarter-wavelength coaxial lines. In order to achieve a reasonably broadband impedance match, the impedance transformation is realized in a number of steps. Conventional output amplifiers are amplifiers, inter alia with two series-arranged, quarter-wavelength, coaxial conductors arranged in air with which the desired input impedance of the output amplifier is obtained. Such output amplifiers are comparatively bulky, as in the VHF-range at 200 MHz $\lambda/4$ is approximately 37.5 cm so that the two required transformers have an overall height of 75 cm. In band 2 of the VHF range, commonly used for FM radio transmission (88–108 MHz) the overall height is even of the order of 150 cm. In addition, the output amplifiers comprise means for tuning the input of the output amplifier to the operating frequency within the frequency range band 2 and 3 of the VHF range for which the output amplifier is suitable.

SUMMARY OF THE INVENTION

The invention has for its object to provide in a simple way an output amplifier of the above-described type which has a low overall height and realizes a broadband impedance match. According to the invention, the output amplifier includes serially-connected first, second and third impedance transformers. The first impedance transformer is dimensioned so that the reactive portion of the first input impedance is substantially zero. The second impedance transformer comprises a number $n(n=2, 3, \ldots)$ of coaxial cables each having a length of approximately a quarter wavelength at the operating frequency, each cable having an input and an output. The outputs of all the cables are connected in parallel to the input of the first impedance transformer. The third impedance transformer comprises a number $m(m=1, 2, 3 \ldots,$ wherein $n/m$ is an integer) of coaxial cables each having a length of approximately a quarter of the wavelength at the operating frequency, each of the m cables having an input and an output. The inputs of the cables of the second impedance transformer are divided into m groups. The output of each cable of the third impedance transformer is connected to the input of one group of cables of the second impedance transformer and the inputs of the cables of the third impedance transformer are interconnected, forming an input for receiving the signals to be amplified, the input having a predetermined impedance level, more specifically 50 Ohms.

Because of the use of mechanically flexible coaxial cable, the overall height is considerably reduced (approximately a factor of 10 in band 3 of the VHF-range; still more in band 2 of the VHF-range). The introduction of electrical flexibility (multiple series/parallel circuit) realizes an impedance match which is very broadband. So it has been found that an output amplifier for band 3 of the VHF-range covers the overall frequency range without the need for tuning of the resonant cavity at the input. A standard quality cable may be used for the coaxial cables of the impedance transformers. It has been found that the impedance match has little sensitivity to tolerances in the specification of the components used.

Preferably, the invention is so utilized for band 3 of the VHF-range (170–230 MHz) that the transmitting tube is a tetrode and that $n=8$ and $m=2$.

BRIEF DESCRIPTION OF THE DRAWING

Embodiments of the invention and its advantages will be further described by way of example with reference to the accompanying drawing, corresponding components having the same reference numerals.

In the drawing.

DESCRIPTION OF THE PREFERRED EMBODIMENTS

Figure 1:
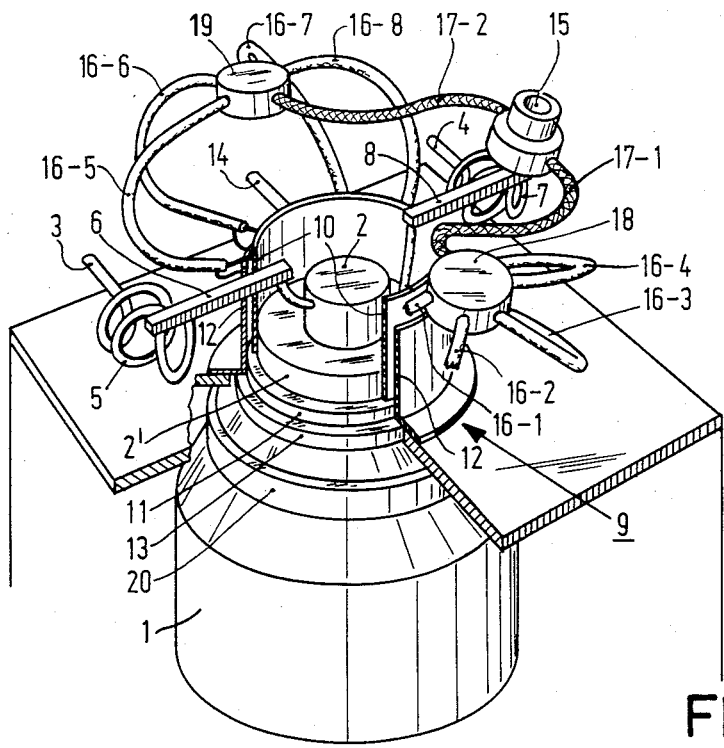
FIG. 1 is a perspective elevational view of an output amplifier in accordance with the invention.

FIG. 1 shows an output amplifier and a transmitting tube 1 arranged therein. A tetrode is employed by way of example. The tetrode comprises a connecting cap 2 (the heater side f(k)) and a connecting ring 2' (the cathode side, k) between which the heater of the tetrode is connected. To enable the supply of current to the heater, the output amplifier has connection terminals 3 and 4. Terminal 3 is connected to the connecting cap 2 via a choke 5, a conductor 6 and spring-fitted contacts (not shown). Terminal 4 is connected to the connecting ring 2' via a choke 7, a conductor 8 and spring-fitted contacts (not shown).

In addition, the output amplifier comprises a coaxial impedance transformer 9. The inner conductor 10 of this transformer is connected at one end to the cathode of the tetrode 1 via the connecting ring 2' on the tetrode 1. The outer conductor 12 of the transformer 9 is connected at the same end to the control grid g1 of the tetrode 1 via a connecting ring 11 on the tetrode 1. The coaxial impedance transformer 9 further comprises fixed isolating capacitors (not shown) for separating the heater voltage and the control grid voltage. The construction and operation of these components are known and are not necessary for understanding the invention.

The other end of the inner and outer conductors are connected, in a manner to be described hereinafter, to the input of the output amplifier.

The control grid g1 of the tetrode 1 is further connected via connecting ring 11 and outer conductor 12 to a terminal 14 for applying the d.c. voltage required for biasing the tetrode 1.

The anode of transmitting tube 1 is supplied, by means not shown, with the required direct voltage via a connecting ring 20. The signal amplified by the tube 1 is thereafter withdrawn from a resonant cavity, not shown, via a probe.

The (alternating current) input signal to be amplified is connected between the cathode k and the control grid g1 of the tetrode 1. To that end the input signal is applied to an input terminal 15 of the output amplifier. Optimum power transfer from the preamplifier—which applies its output power to terminal 15—to the output amplifier requires a certain input impedance of the output amplifier. Let it be assumed that this impedance is 50 Ohms. As the input impedance of the tetrode 1 differs very much therefrom, an impedance transformer is required. A typical value for the impedance of the active portion (g1-k) of a tetrode is 12 Ohms in parallel with 62 pF for a tetrode of the type YL1610.

In order to obtain a broad-band impedance transformation a number of impedance transformers is arranged in series. In accordance with a first feature of the invention the first impedance transformer, the coaxial transformer 9, is dimensioned so that the reactive portion of the impedance is transformed by the transformer to a value zero or substantially zero. The impedance $Z_0 = R_0 + jX_0$ at one end (the tube end) of the transformer 9 is thus transformed to an impedance $Z_1 = R_1 + jX_1$ at the other end of the transformer, wherein however $X_1 \approx 0$.

In accordance with a second feature of the invention this impedance $R_1$ is transformed to the desired input impedance of, for example, 50 Ohms. For that purpose the output amplifier comprises a second and a third impedance transformer 16, 17 respectively. The second impedance transformer comprises n (in the FIG. n=8) coaxial cables 16-1, 16-2, . . . 16-8. The cables have an (electrical) length equal to a quarter of the wavelength in the operating range of the output amplifier. For VHF band 3 (170–230 MHz) the coaxial cables 16-1, . . . 16-8 have an (electrical) length of only 37.5 cm. Because of the fact that the dielectric used has a relative dielectric constant $\epsilon_r > 1$, the physical length of each of the cables is still shorter. The characteristic impedance of the cables is 60 Ohms. At one end the coaxial cables 16 are connected in parallel to the transformer 9. As regards the other end, the coaxial cables are divided into a number (m) of groups (in the Figure m=2). One group of cables, namely 16-1, 16-2, 16-3 and 16-4 are interconnected at this other end by means of a terminal block 18 and the other group of cables, namely 16-5, 16-6, 16-7 and 16-8 are interconnected at this other end via a terminal block 19.

The third impedance transformer comprises two coaxial cables 17-1 and 17-2 each having a characteristic impedance of 50 Ohms and each being a quarter wavelength long. Consequently, n being equal to 8 and m being equal to 2, the ratio n/m is equal to 4. One end of each of these cables is connected to terminal block 18 or 19, respectively, and the other ends are connected to terminal 15. With an impedance of 50 ohms connected to terminal 15, the output impedance of the third impedance transformer is 12.5 Ohms. The characteristic impedance (two 50 Ohm cables in parallel: 50/2=25 Ohms) is equal to the square root of the product of the input impedance (50 Ohm) and the output impedance. The output impedance of the second impedance transformer then amounts to $(60/8)^2/12.5 = 4.5$ Ohm.

Because of their mechanical flexibility the second and third impedance transformers can be very compact. By utilizing the electrical degrees of freedom introduced, the impedance transformation can be adapted to the type of transmitting tube with which the output amplifier is equipped.

Figure 2:
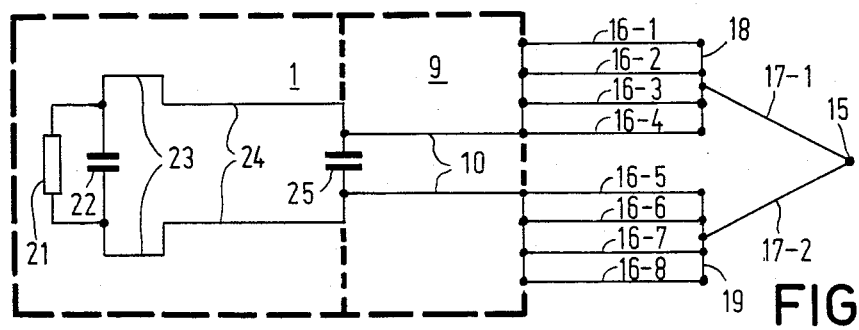
FIG. 2 is a schematic representation of a first embodiment of the output amplifier in accordance with the invention.

FIG. 2 shows the circuit diagram of an output amplifier of a certain type (type A) of transmitting tube. The active portion of the transmitting tube 1 may be represented by a resistor 21 (having a value of some Ohms) arranged in parallel with a capacitor 22 (some dozens of pF). The passive portion comprises the transmission lines 23 and 24. The capacitance 25 (the capacitance due to the ceramic material between control grid and cathode terminal) amounts to some pF. The first, second and third impedance transformers are of the same construction as described with reference to FIG. 1. Generally, the second and third impedance transformers may comprise a larger or lesser number of coaxial cables. Owing to requirements as regards symmetry, it is necessary for the ratio n/m of the number of cable conductors (n) of the second impedance transformer and the number of cables of the third impedance transformer (m) to be an integer.

Figure 3:
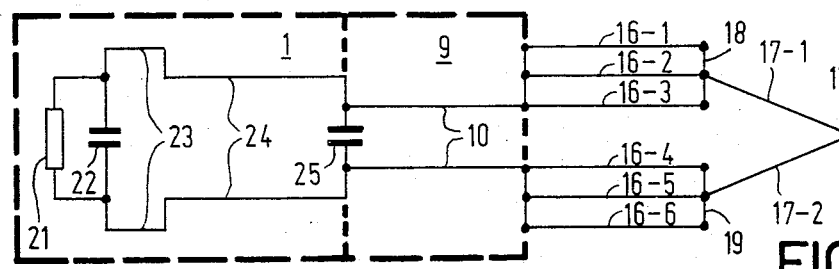
FIG. 3 is a schematic representation of a second embodiment of the output amplifier in accordance with the invention.

FIG. 3 shows the circuit diagram of an output amplifier for a type B transmitting tube. For a transmitting tube of this type (YL1610) the parameters have the following values:

resistor 21: 12 Ohms capacitor 22: 62 pF transmission line 23: length 1.5 cm; $Z_z = 26.3$ Ohms transmission line 24: length 3.5 cm: $Z = 15.7$ Ohms capacitor 25: 6 pF first impedance transformer 9: length 9.24 cm; $Z = 6.69$ Ohms second impedance transformer: 6 coaxial cables 16 each having an electric length of $\lambda/4 = 37.5$ cm (the physical length is shorter, depending on the value of $\epsilon_r$); $Z = 50$ Ohm.

third impedance transformer: 2 coaxial cables 17 each having a length of $\lambda/4 = 37.5$ cm (the physical length is shorter, depending on the value of $\epsilon_r$); $Z = 50$ Ohm.

n=6; m=2; n/m=3.

In band 2 of the VHF-range, commonly used for FM radio transmission (88–108 MHz) a preamplifier was realized for which n=4 and m=2, consequently n/m=2.

The output amplifier of the above-described construction has a number of advantages. As has already been mentioned in the foregoing, the overall height has been drastically reduced. The transforming action of the three impedance transformers is in addition frequency-independent to such an extent that, for example, a resonant cavity for band 3 does not require any tuning at the input. The standing-wave ratio over that wide frequency range is very low (VSWR < 1.4). The second and third impedance transformers can be manufactured very economically: in many cases the required impedance transformation can be realized by means of standard (50, 60 or 75 Ohm) cables. It has been found that the standing-wave ratio is sensitive only to a very low degree to manufacturing tolerances of the cables used.

In practice, the first impedance transformer also has perfectly acceptable dimensions (a length of 5 to 10 cm).

What is claimed is:

1. In an output amplifier for a transmitting tube having an operating frequency in the band 40–400 MHz, said output amplifier including impedance transformation means for matching the input impedance of the transmitting tube to a predefined resistive output impedance of an apparatus for applying to the output amplifier a signal to be amplified, said impedance transformation means comprising:
   (a) a first impedance transformer including first and second coaxially-arranged cylindrical conductors, said first impedance transformer having an input end, having an output end electrically-connected to the transmitting tube, and being dimensioned such that the reactive component of its input impedance is substantially equal to zero;
   (b) a second impedance transformer including n coaxial cables each having a length of approximately ¼ wavelength at the operating frequency, each cable having an input end and an output end, said output ends being electrically-connected to the input end of the first impedance transformer; and
   (c) a third impedance transformer including m coaxial cables each having a length of approximately ¼ wavelength at the operating frequency, each cable having an input end and an output end, n/m being an integer defining a number of groups of the cables in the second impedance transformer, the output end of each cable in the third impedance transformer being electrically-connected to the input ends of a respective group of the cables in the second impedance transformer, and the input ends of the cables in the third impedance transformer being electrically-connected to an input for receiving the signal to be amplified.

2. An output amplifier as in claim 1 where n=8 and m=2.

3. An output amplifier as in claim 2 where the transmitting tube comprises a tetrode having an operating frequency in the band 170–230 MHz.

4. An output amplifier as in claim 1 where n=6 and m=2.

5. An output amplifier as in claim 4 where the transmitting tube is a tetrode having an operating frequency in the band 170–230 MHz.

* * * * *